(12) United States Patent
Hattori

(10) Patent No.: US 8,120,750 B2
(45) Date of Patent: Feb. 21, 2012

(54) EXPOSURE APPARATUS AND METHOD OF MANUFACTURING DEVICE

(75) Inventor: Tadashi Hattori, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 429 days.

(21) Appl. No.: 12/482,797

(22) Filed: Jun. 11, 2009

(65) Prior Publication Data

US 2009/0310109 A1   Dec. 17, 2009

(30) Foreign Application Priority Data

Jun. 17, 2008  (JP) .................................. 2008-158550

(51) Int. Cl.
*G03B 27/42* (2006.01)
*G03B 27/52* (2006.01)

(52) U.S. Cl. ........................................... 355/53; 355/55

(58) Field of Classification Search .................... 355/52, 355/53, 55, 67; 356/500, 510
See application file for complete search history.

(56) References Cited

U.S. PATENT DOCUMENTS 6,462,828 B1 * 10/2002 Takeishi ........................ 356/500
7,042,576 B2   5/2006 Hattori ........................... 356/500
7,499,180 B2   3/2009 Hattori ........................... 356/510

FOREIGN PATENT DOCUMENTS

JP         2001-15422      1/2001

* cited by examiner

*Primary Examiner* — Hung Henry Nguiyen
(74) *Attorney, Agent, or Firm* — Fitzpatrick, Cella, Harper & Scinto

(57) ABSTRACT

When a substrate stage is located in a first area, a first measurement device measures the same portion of the substrate at the plural measurement points both before and after the stage is horizontally driven. A controller calculates a first difference of the stage in the vertical direction in the first area accompanying driving of the stage horizontally, based on a first measurement result, calculates a value representing a surface shape of the substrate by subtracting the first difference from the first measurement result, calculates a second difference of the stage in the vertical direction in the second area accompanying driving of the stage horizontally by subtracting the value from a value representing a vertical position of the substrate when the stage is located in the second area, and controls a vertical position of the stage in the second area based on the second difference.

10 Claims, 14 Drawing Sheets

EXPOSURE APPARATUS AND METHOD OF MANUFACTURING DEVICE

BACKGROUND OF THE INVENTION

1. Field of the Invention

The present invention relates to an exposure apparatus and a method of manufacturing a device.

2. Description of the Related Art

An exposure apparatus (stepper) of the step-and-repeat scheme transfers a pattern on a reticle onto a substrate by reducing light passing through the reticle at a predetermined ratio using a projection optical system and exposing a photoresist applied on the substrate to light while keeping the substrate in a stationary state in a predetermined place. This apparatus repeatedly performs shooting operation on the entire surface of the substrate by sequentially driving a substrate stage on which the substrate is placed.

As compared with a stepper designed to perform one-shot exposure on a stationary substrate, an exposure apparatus (scanner) of the step-and-scan scheme exposes a wider area to light while synchronously scanning a substrate and a reticle.

In general, in the semiconductor manufacture using an exposure apparatus, it is necessary to repeatedly perform exposure on the same substrate. That is, it is necessary to perform exposure on a shot on which a pattern has already been formed upon superimposing another pattern on it with high accuracy. For this purpose, it is necessary to measure an array of shots in advance. This measurement uses a technique of recording measurement marks on patterns in advance and measuring the marks by using a scope. As this scope, an off-axis scope (to be abbreviated as an "OAS" hereinafter) using non-exposure light is generally used. Although the OAS can perform measurement without exposing a resist to light because it performs measurement by using non-exposure light, since light cannot be made to pass through a lens, the OAS and the lens need to be placed apart from each other, as shown in FIG. 6.

In order to measure a mark with the OAS, it is necessary for the OAS to measure the mark at the best focus. There is also available a technique of searching for a position at which the image plane of the scope of an OAS is located at the best focus by driving a substrate stage in the Z direction. This technique, however, takes a lot of time to perform measurement, and hence is disadvantageous in terms of throughput. In general, therefore, a technique using another focus sensor is used.

The focus sensor placed at the OAS position is used to align a substrate surface with the best focus position of the OAS, but is not used for actual exposure. In general, when performing exposure below a lens, a scanner performs real-time focusing to focus the lens while driving the substrate stage. As shown in FIG. 6, the focus sensor is placed at a position shifted from the actual exposure position (slit) backward/forward, that is, in the Y direction. When performing exposure upon scanning/moving the substrate stage from a lower position on the drawing surface, the apparatus measures the Z position of a substrate surface at a measurement point 6C with the focus sensor before exposure, and drives the substrate stage in the Z direction before an exposure position reaches the slit position. When scanning/moving the substrate stage from an upper position on the drawing surface, the apparatus uses a measurement point 6A of the focus sensor in the same manner. In order to check whether the substrate surface is driven into the lens image plane below the slit, a measurement point 6B of the focus sensor is also placed at the slit position. In addition, arranging a plurality of focus sensor measurement points in the X direction can also detect the tilt component of the substrate surface within the slit. As described above, since a focus is measured immediately before exposure, there is no need to measure the focus of the entire substrate surface in advance. That is, there is no reduction in throughput.

The following is an exposure sequence using the OAS. When a substrate is transferred, the apparatus measures the mark of each sample shot on the substrate by using the OAS. The apparatus calculates error components such as substrate placement errors (XY and rotation components) and thermal expansion from the measurement result. The apparatus then exposes each shot to light by moving the substrate to a position below the lens. As the number of sample shots increases, the superimposition accuracy increases, but the throughput decreases.

As a scheme of improving throughput and accuracy by simultaneously performing measurement and exposure on a sample shot, an exposure apparatus with a twin-stage arrangement is available, which includes two substrate stages and performs exposure on one substrate while performing measurement on the other substrate by using an OAS. Note that an arrangement having one substrate stage is called a single-stage arrangement.

FIG. 7 shows a twin-stage arrangement. When a substrate is placed on one substrate stage, this apparatus measures the displacement of a shot in the X and Y directions first using the OAS. The apparatus then performs measurement on the entire substrate surface at measurement points 7B using a focus sensor. The apparatus performs this operation concurrently with exposure on a substrate on the other substrate stage. If the apparatus completes focus measurement by performing measurement on one substrate by using OAS before exposure on the other substrate, even increasing the number of sample shots will not degrade the throughput. It is therefore possible to satisfy both the requirements for throughput and accuracy.

In general, the measurement points 7B of the focus sensor are arrayed in the X direction. This arrangement shortens the measurement time by measuring more widths when scanning in the Y direction. Laser interferometers are respectively arranged at a lens position and an OAS position.

A substrate stage is required to be driven to an arbitrary place on a two-dimensional plane (X-Y plane) with high accuracy throughout a wide range. This is because, the accuracy required becomes severer with a reduction in the size of a semiconductor circuit, and at the same time, the driving range of the substrate stage needs to be a very wide to cope with an increase in the diameter of a substrate.

A laser interferometer is generally used to detect the position of a substrate stage. Placing the laser interferometer within an X-Y plane can measure the position of the substrate stage within the X-Y plane. For example, as shown in FIG. 1, a bar mirror 2A for X-axis measurement is mounted on the substrate stage 1 along the Y-axis direction. A laser interferometer 3A1 to measure a position in the X-axis direction detects the relative driving amount of the substrate stage by irradiating the bar mirror 2A with laser light almost parallel to the X-axis and making the reflected light interfere with reference light. The same applies to measurement on the Y-axis. Preparing two interferometers for at least one of the X-axis and the Y-axis can detect a rotational angle θz of the substrate stage around the Z-axis.

Actuating an actuator (not shown) such as a linear motor based on the position information obtained from the laser interferometers can drive the substrate stage to a predetermined place.

In addition, as the NA of the lens increases with a reduction in circuit size, the allowable range of focus (depth of focus) for transferring an image on a reticle onto a substrate decreases, resulting in severer accuracy required for positioning in the focus direction (Z direction). For this reason, it is necessary to control the substrate stage upon accurate measurement of the Z-axis direction (focus direction) perpendicular to the X-Y plane, the tilt in the X-axis direction (to be referred to as rotation, tilt, or θy around the Y-axis), and the tilt in the Y-axis direction (to be referred to as rotation, tilt, or θx around the X-axis). As shown in FIG. 1, there is provided a scheme which has two X-axis laser interferometers 3A1 and 3A2 of two systems arranged side by side in the Z-axis direction to simultaneously perform position measurement, and measures the tilt θy of the substrate stage 1 in the X-axis direction from the difference between the measurement data. Likewise, arranging Y-axis laser interferometers 3B1 and 3B2 of two systems can measure the tilt θx associated with the Y-axis direction.

There is proposed a technique of measuring the position of the substrate stage 1 in the Z-axis direction also by using a laser interferometer. FIG. 2 shows an example of the arrangement of a Z laser interferometer for detecting a position in the Z-axis direction. The laser light emitted from the Z laser interferometer is reflected upward by a 45° reflecting mirror 4A mounted on the X stage. A 45° reflecting mirror 4B placed on a lens base as a reference reflects the laser light in the horizontal direction. A 45° reflecting mirror 4C placed near almost the lens center projects the laser light downward. A reflecting mirror 4D placed on the substrate stage 1 vertically reflects the laser light. The laser light then returns along the same path. The reflecting mirror 4A is mounted on the X stage. As the X position of the substrate stage 1 moves, the reflected laser light also moves in the X direction. Therefore, as the 45° reflecting mirrors 4B and 4C, bar mirrors which are elongated in the X-axis direction are used. Using such type of mirrors makes it possible to irradiate the substrate stage 1 with laser light at the same position even if the substrate stage 1 moves in the X-axis direction. When the substrate stage 1 moves in the Y-axis direction, since the 45° reflecting mirror 4A is mounted on the X stage, the position of the reflecting mirror 4A does not change, and hence the position of laser light does not change. For this reason, the relative position between the Y position of the substrate stage 1 and laser light moves, and hence a bar mirror 4D which is elongated in the Y-axis direction is placed on the substrate stage. This makes it possible to always irradiate the mirror surface of the substrate stage 1 with laser light even if the substrate stage 1 moves in the Y-axis direction. It is therefore possible to always perform measurement with the laser interferometer even if the substrate stage 1 moves in the X-Y plane.

It is also possible to measure the relative positions of the substrate stage 1 and the lens base surface by placing a 45° bar mirror 4E extending in the Y-axis direction on the substrate stage 1 and placing a bar mirror 4F extending in the X-axis direction on the lens base, as shown in FIG. 3, instead of the Z interferometer in FIG. 2.

In either of the arrangements shown in FIGS. 2 and 3, Z interferometer arrangements are symmetrically provided on the left and right sides (to be referred to as the L and R sides, respectively) of the stage. If positions in the Z-axis direction on the L and R sides can be simultaneously measured on the entire X-Y plane, the Z position of the substrate stage 1 can be measured more accurately by averaging the measurements. In addition, measuring the difference between them can also measure the tilt of the substrate stage 1.

When the substrate stage 1 is driven in the X-axis direction, the plane accuracy of the bar mirrors 4B, 4C, and 4F extending in the X-axis direction influences the positioning accuracy. Likewise, when the substrate stage 1 is driven in the Y-axis direction, the plane accuracy of the bar mirrors 4D and 4E extending in the Y direction influences the positioning accuracy. Although nm-order accuracy is required as the positioning accuracy of the substrate stage 1 in the Z-axis direction, as described above, it is technically difficult as well to process the entire surfaces of bar mirrors with nm accuracy and assemble them.

Japanese Patent Laid-Open No. 2001-15422 has proposed a technique of improving the positioning accuracy in the Z direction at all X-Y positions on a substrate stage by measuring an error originating from the process accuracy of bar mirrors in advance by using a focus sensor and setting a target position in consideration of the error when driving the substrate stage. An error originating from the process accuracy of bar mirrors is nothing but a Z error (to be referred to as a "stage moving plane" hereinafter) caused by X-Y driving of the substrate stage which is measured by using the focus sensor. This technique measures a substrate mounted on the substrate stage or a reflecting plane substituting for the substrate by using a focus sensor. Although the surface shape of a substrate influences this measurement, using a plurality of focus sensors will remove the influence of the surface shape of the substrate and measure only a stage moving plane error. As shown in FIG. 5, this technique measures a given portion P on a substrate first by using a focus sensor 6A, and then measures the same portion P on the substrate by using a focus sensor 6B after driving the substrate stage. Since the focus sensors 6A and 6B measure the same portion P, the same measurement values should be obtained regardless of the shape of the substrate. If the measurement values differ from each other, it indicates that the substrate stage has an error in the Z direction, that is, the stage is influenced by the process accuracy of the bar mirrors. This makes it possible to measure the shapes of the bar mirrors without any influences of the substrate surface.

The measurement technique for a Z bar mirror (a generic term for a ZX bar mirror and ZY bar mirror) which uses focus sensors excels in the capability of auto-calibration requiring no special tool. Not only a Z bar mirror but also an X bar mirror or Y bar mirror may deform due to an impact produced at the time of resetting (home seeking) of the apparatus or deterioration with time. It is therefore necessary to periodically measure the shape of the bar mirror. The technique of measuring the shape of a bar mirror without requiring any special tools is very important.

As shown in FIG. 4, it is also possible to use a technique of forming a stage capable of Z-tilt driving on a substrate stage 1 which slides on an X-Y plane with reference to a substrate stage base surface, and measuring the distance between the substrate stage 1 and the Z-tilt stage by a linear encoder. The difference between the technique shown in FIG. 5 and that shown in FIG. 4 is nothing but whether a measurement target is a bar mirror or a stage base surface. Although the Z-tilt measurement technique using a bar mirror will be described below, a stage base surface can also be measured in the same manner.

As described above, the Z bar mirror measurement method using the focus sensor excels in that the apparatus can perform only auto-calibration without requiring any special tools. However, this measurement device performs measurement by using a substrate, and hence has a drawback that it can measure only within the range of the substrate. In general, the range in which high positioning accuracy is required in the Z-axis direction is only the range on a substrate. For this reason, the above drawback does not pose any serious problem. For example, a reference mark is recorded on a substrate stage. Even if this mark is located outside the range of the substrate, a Z error at the position of the mark can be measured and be subjected to offset management in advance.

If, however, a mark on a substrate at a position different from an exposure position is measured by using an OAS or the like, or if focus measurement or alignment measurement is performed in a place different from the exposure position as in the case of a twin-stage arrangement, the above drawback poses the following problems.

[Problems Arising in Single-Stage Arrangement Using OAS]

As shown in FIG. 6, the OAS is spaced apart from the lens. For the sake of descriptive convenience, assume that the OAS is spaced apart from the lens by Yo [mm] in the Y direction. Since the OAS also needs to measure all the surfaces of the shots on the substrate, the ZY bar mirror must be elongated by Yo [mm]. However, a ZY bar mirror measurement device using a plurality of focus sensors can measure only a given area on a substrate. For this reason, the elongated portion corresponding to the length Yo for this OAS cannot be measured. If a plurality of focus sensors is arranged at the OAS position, the elongated portion corresponding to the length Yo for this OAS can be measured. However, since a measurement mark is very small, placing a plurality of focus sensors provides no merit in terms of cost and accuracy. Therefore, the bar mirror measurement technique using a plurality of focus sensors cannot be used at the OAS position. As described above, while the bar mirror is not properly measured at the OAS position and the stage moving plane is not corrected, driving a mark on a substrate below the OAS will produce a measurement error on the substrate stage in the Z-axis direction. For this reason, when the focus sensor performs measurement below the lens, it is necessary to greatly drive the substrate stage in the Z-axis direction, resulting in reductions in throughput and the productivity of the apparatus.

[Problems Arising in Twin-Stage Arrangement]

As shown in FIG. 7, in the twin-stage arrangement, since the OAS performs focus measurement, a focus sensor is generally placed at only the OAS position. It suffices to place at least one focus sensor below the lens to measure an error after stage switching. If the error after stage switching is sufficiently small, it is not necessary to use any focus sensor. For this reason, it is not possible to measure the Z bar mirror at the exposure position by using a plurality of focus sensors. Since the shape of the Z bar mirror cannot be measured below the lens, even if the shape of the entire substrate surface is measured at the OAS position, the substrate stage has an error in the Z-axis direction due to the influence of the Z bar mirror when exposure is performed at the lens position. This makes it impossible to accurately match the substrate surface with the lens image plane. As a result, defocus occurs, and a pattern cannot be transferred onto the substrate.

SUMMARY OF THE INVENTION

The present invention provides an exposure apparatus which improves the measurement accuracy in the vertical direction by calculating errors in the vertical direction which accompany the driving of a substrate stage in the horizontal direction in the entire area in which the substrate stage is driven in the horizontal direction.

According to the present invention, there is provided an exposure apparatus which projects a pattern on a reticle onto a substrate via a projection optical system and scanning-exposes the substrate, the apparatus comprising a driving mechanism configured to drive a substrate stage holding the substrate in a horizontal direction and a vertical direction in each of a first area and a second area, a first measurement device configured to measure a position of the substrate in the vertical direction at a plurality of measurement points in the first area, and a controller, wherein when the substrate stage is located in the first area, the controller causes the first measurement device to measure the same portion of the substrate at the plurality of measurement points both before and after the substrate stage is driven in the horizontal direction, calculates a first difference of the substrate stage in the vertical direction in the first area accompanying driving of the substrate stage in the horizontal direction, based on a first measurement result obtained by using the first measurement device, calculates a numerical value representing a surface shape of the substrate by subtracting the first difference from the first measurement result, calculates a second difference of the substrate stage in the vertical direction in the second area accompanying driving of the substrate stage in the horizontal direction by subtracting the numerical value associated with the surface shape of the substrate from a numerical value representing a position of the substrate in the vertical direction when the substrate stage is located in the second area, and controls a position of the substrate stage in the vertical direction in the second area based on the second difference.

The present invention can provide an exposure apparatus which improves the measurement accuracy in the vertical direction by calculating errors in the vertical direction which accompany the driving of a substrate stage in the horizontal direction in the entire area in which the substrate stage is driven in the horizontal direction.

Further features of the present invention will become apparent from the following description of exemplary embodiments with reference to the attached drawings.

DESCRIPTION OF THE EMBODIMENTS

An example of an exposure apparatus according to the present invention will be described below, which projects, via a projection optical system, a pattern on a reticle onto a substrate held on a substrate stage and scanning-exposes the substrate. The exposure apparatus according to the present invention includes a driving mechanism which drives the substrate stage in the horizontal direction (X- and Y-axis directions) and the vertical direction (Z-axis direction) in each of first and second areas. The exposure apparatus also includes a first measurement device which measures the position of a substrate in the vertical direction at a plurality of measurement points in the first area and a controller (to be described later).

First Embodiment

Figure 6:
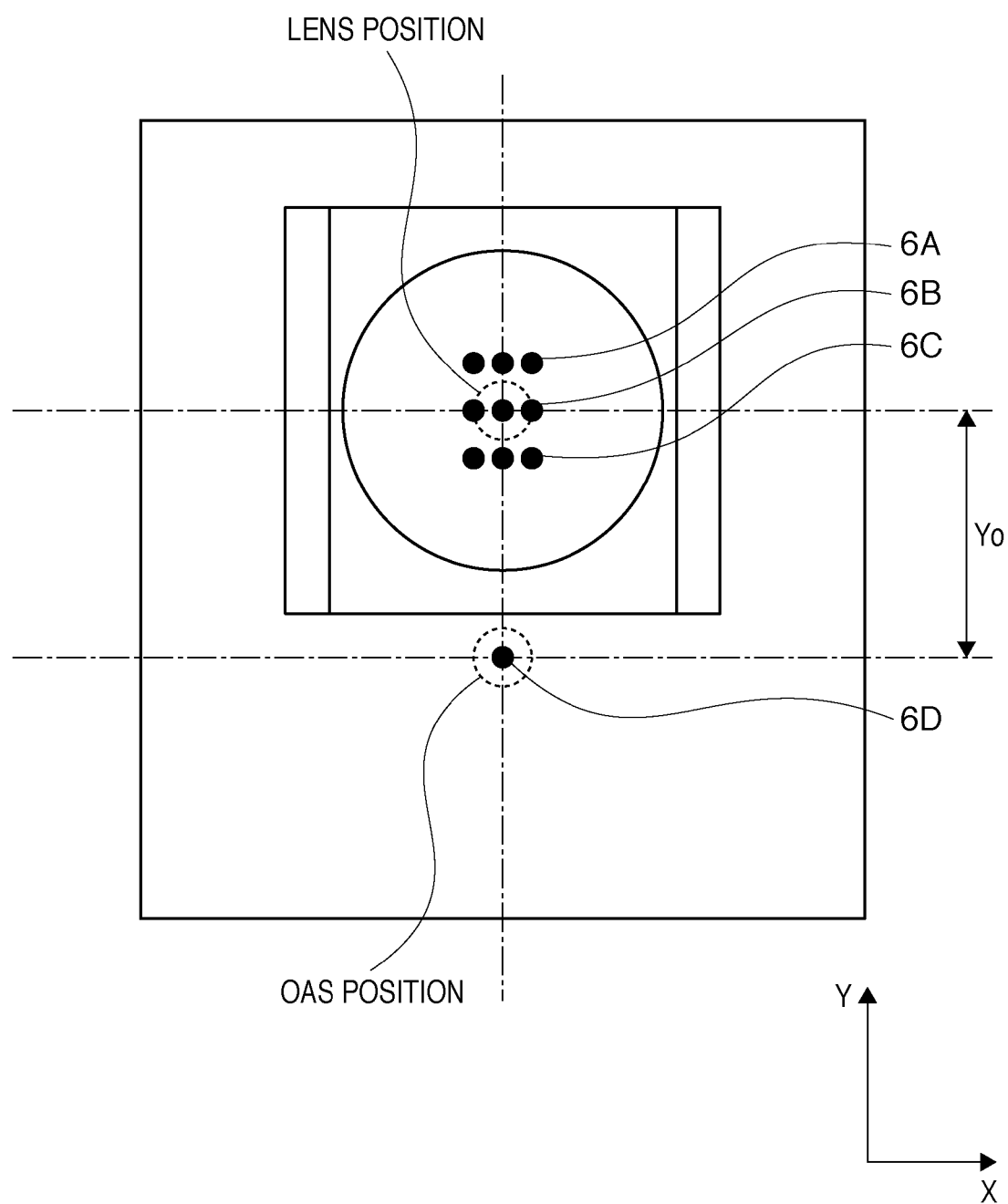
FIG. 6 is a view showing the arrangement of focus sensors on a single stage using an OAS.
Figure 7:
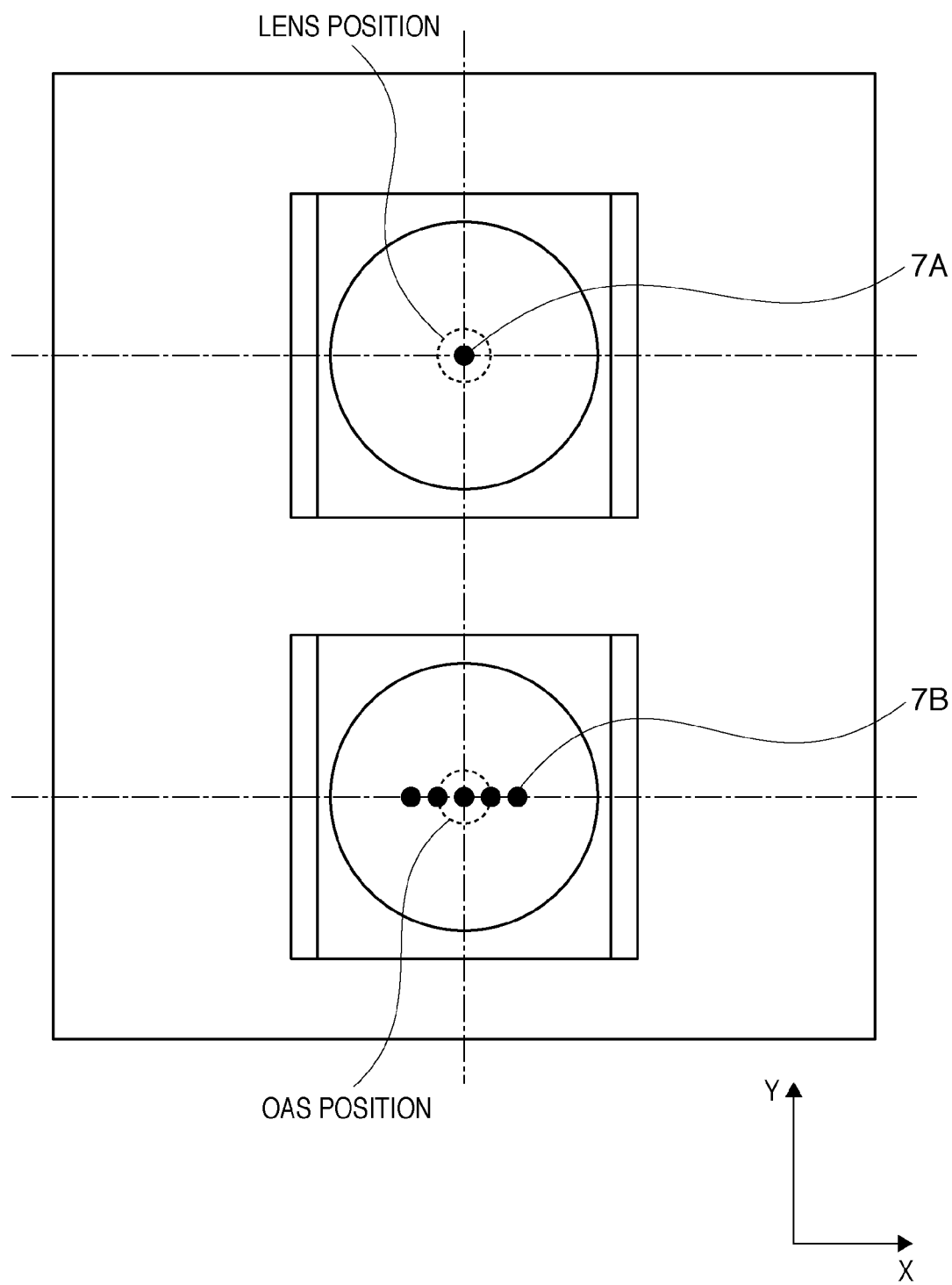
FIG. 7 is a view showing the arrangement of focus sensors on twin stages.

The first embodiment is an application example of the present invention to an exposure apparatus with a single-stage arrangement using an off-axis scope (OAS). FIG. 6 shows the exposure apparatus including the OAS. In this embodiment, it is possible to detect an alignment mark formed on a pattern in advance by using the OAS spaced apart from a projection optical system. This apparatus then exposes the measured substrate to light via the projection optical system. In this embodiment, the OAS area where the OAS is placed forms the second area, and the area where the projection optical system is placed forms the first area. The projection optical system is placed near a focus sensor which measures the position of a substrate in the vertical direction at a plurality of measurement points in the first area (to be described later).

The substrate stage 1 is a combination of an X-Y stage which can freely move within an X-Y plane and a fine moving stage which is mounted on the X-Y stage and can be driven for tilt correction in the Z-axis and θz directions. This makes it possible for the substrate stage 1 to translationally move in the X-, Y-, and Z-axis directions and rotationally move around the respective axes (θx, θy, and θz).

Laser interferometers 3A1 and 3B1 measure the positions of the substrate stage 1 in the X- and Y-axis directions. Since the driving strokes in the X- and Y-axis directions are long, an X bar mirror 2A elongated in the Y-axis direction is used to measure a driving position in the X-axis direction, and a Y bar mirror 2B elongated in the X-axis direction is used to measure a driving position in the Y-axis direction.

It is possible to measure a displacement amount θz of the stage in a rotating direction within the X-Y plane by preparing the laser interferometers 3A1 and 3B1 on at least one of the X- and Y-axis sides, together with different laser interferometers 3A3 and 3B3 spaced apart from the laser interferometers 3A1 and 3B1 in the horizontal direction. For example, the θz laser interferometer 3A3 for measuring the rotation of the stage within the X-Y plane is spaced apart from the laser interferometer (X laser interferometer) 3A1 in the X-axis direction by an interval Ay in the horizontal direction and placed at the same level as that of the laser interferometer 3A1 in the Z-axis direction. In addition, a θy laser interferometer 3A2 for measuring the rotation of the substrate stage 1 around the Y-axis is spaced apart from the laser interferometer 3A1 by an interval Δz in the vertical direction and is placed beside the laser interferometer 3A1 without any displacement in the horizontal direction. The above arrangement allows measuring the X and Y positions of the substrate stage 1, θ as a rotation component around each axis, and the tilt of the stage.

Figure 1:
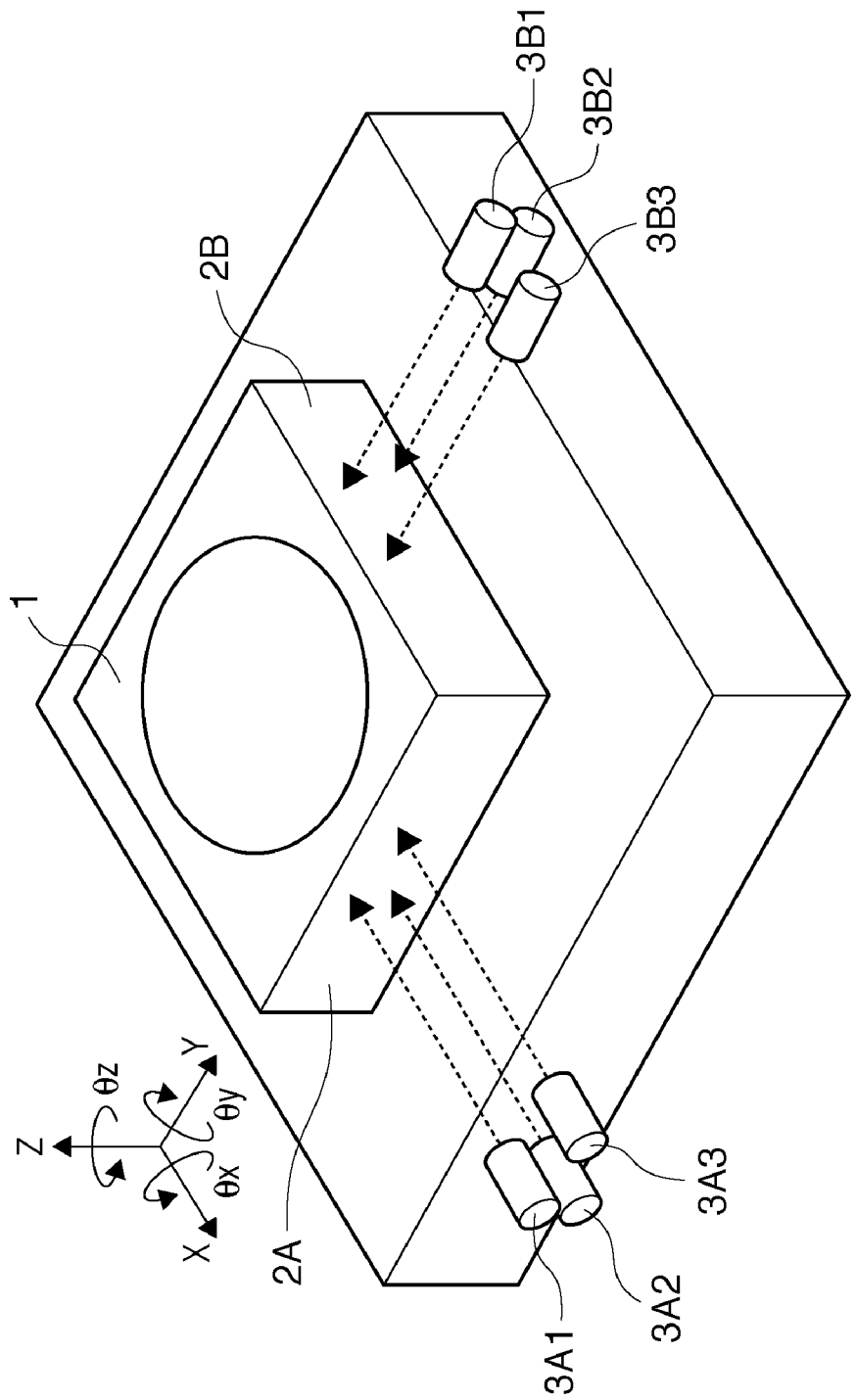
FIG. 1 is a perspective view showing a substrate stage arrangement capable of performing measurement associated with the tilt of a substrate stage.
Figure 2:
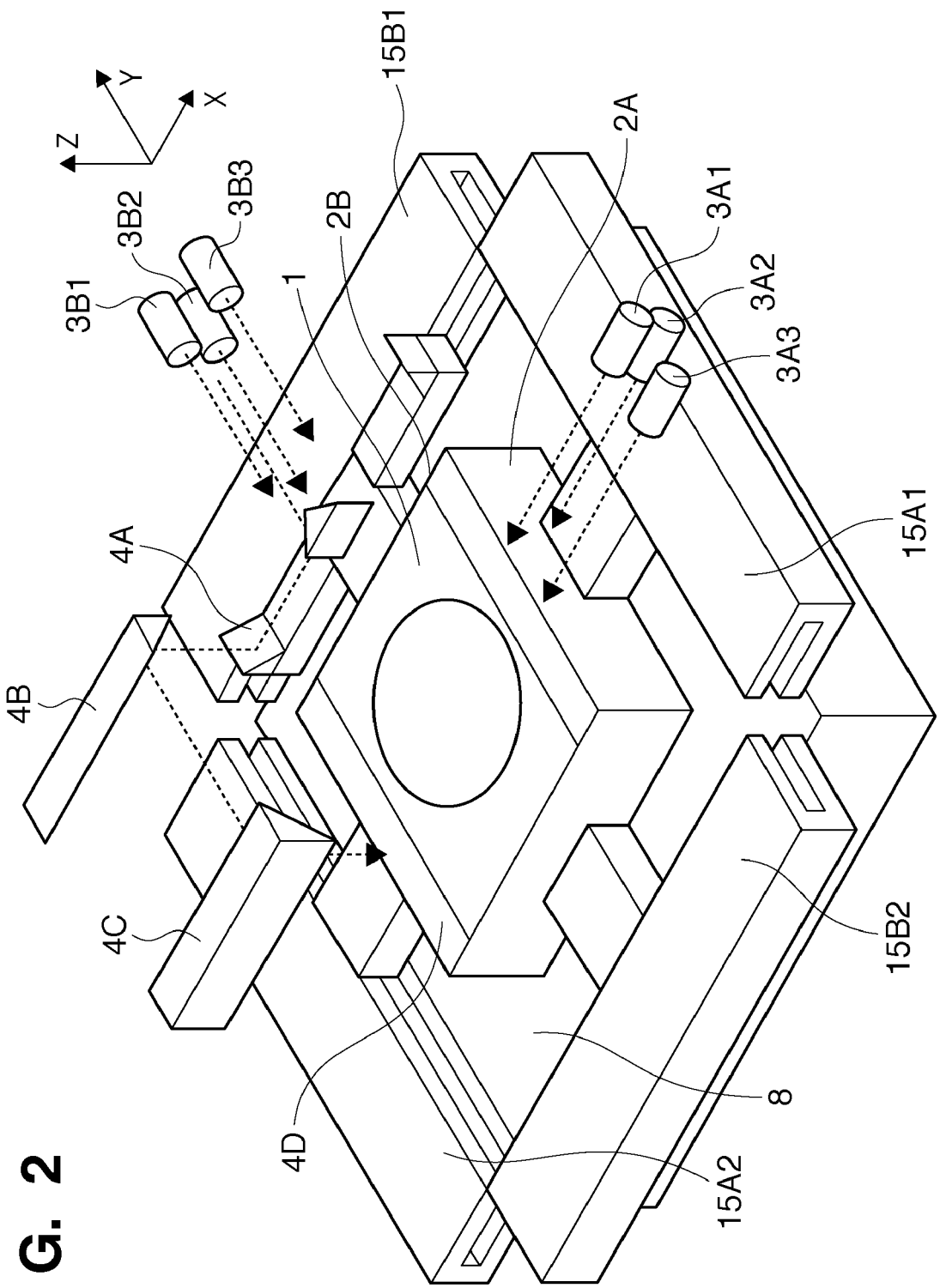
FIG. 2 is a perspective view showing the arrangement of a Z laser interferometer.

The arrangement of the Z interferometer will be described next. As shown in FIG. 2, a 45° mirror 4A mounted on the substrate stage 1 vertically reflects laser light upward. A 45° mirror 4B placed on a lens base as a reference reflects the laser beam horizontally. A 45° mirror 4C placed near almost the lens center vertically projects the laser light downward. A reflecting mirror 4D placed on the substrate stage 1 vertically reflects the laser light. The laser light then returns along the same path. The 45° mirror 4A is placed on the X stage. When the X position of the substrate stage 1 moves, reflected laser light also moves in the X-axis direction. For this reason, as the 45° mirrors 4B and 4C, bar mirrors elongated in the X-axis direction are placed. This makes it possible to irradiate the substrate stage 1 with a laser beam at the same position even if the substrate stage 1 moves in the X-axis direction. When the substrate stage 1 moves in the Y-axis direction, since the 45° mirror 4A is mounted on the X stage, the position of the laser light does not change. As a consequence, since the relative position between the Y position of the substrate stage 1 and the laser light moves, the reflecting mirror 4D extending in the Y-axis direction is placed on the substrate stage. With this arrangement, even if the substrate stage 1 moves in the Y-axis direction, laser light is always incident on the mirror surface of the substrate stage 1. Therefore, even if the substrate stage 1 moves within the X-Y plane, measurement can always be performed by the laser interferometer.

In the case of this stage arrangement, a bar mirror shape in the Z-axis direction influences the accuracy of the substrate stage 1 in the Z-axis direction. That is, when the substrate stage 1 is driven in the X-axis direction, the surface shapes of the bar mirrors 4B and 4C influence the substrate stage 1. When the substrate stage 1 is driven in the Y-axis direction, the surface shape of the reflecting mirror 4D influences the substrate stage 1. The bar mirrors 4B and 4C will be referred to as ZX bar mirrors, and the bar mirror 4D will be referred to as a ZY bar mirror.

Figure 3:
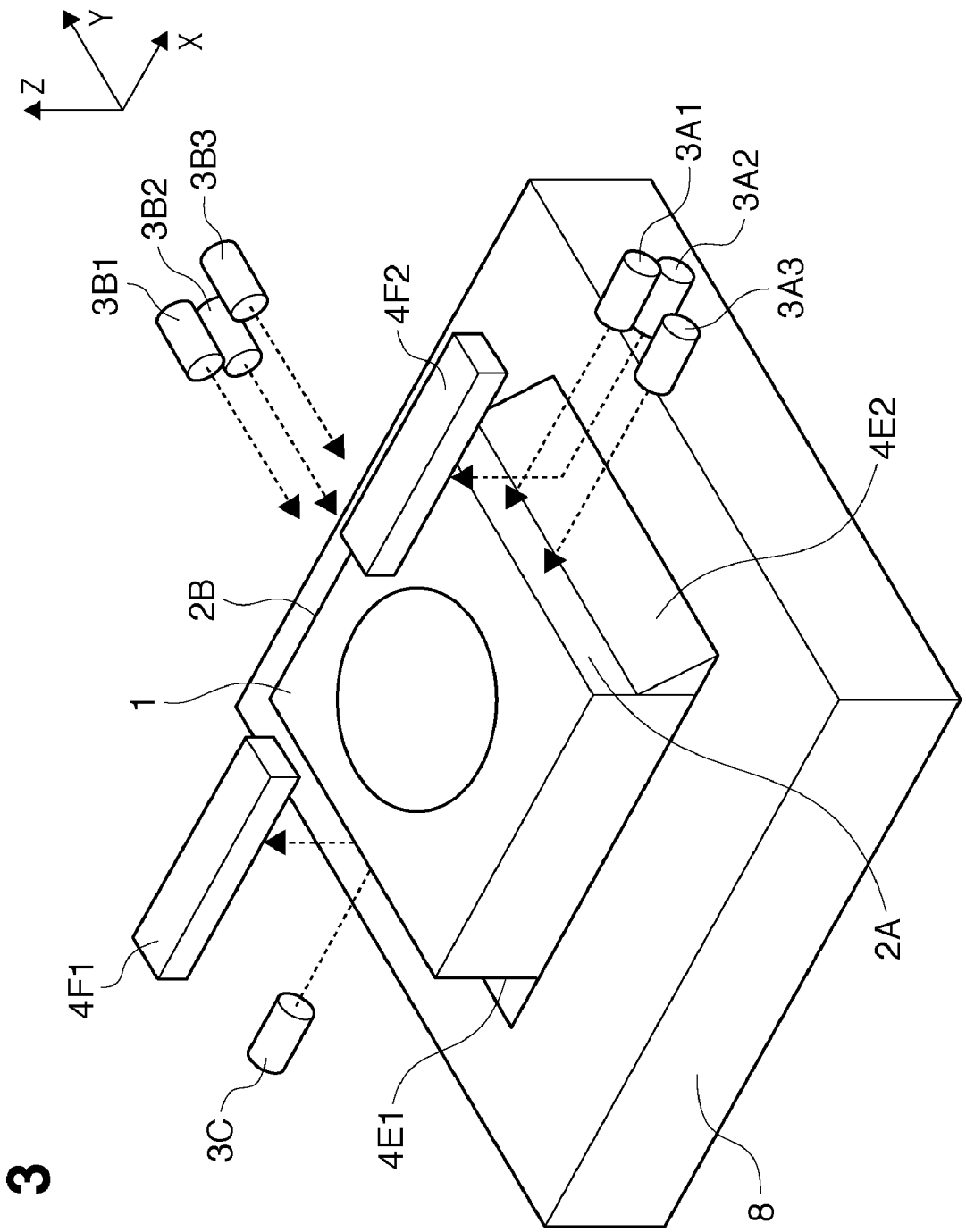
FIG. 3 is a perspective view showing another arrangement of the Z laser interferometer.
Figure 4:
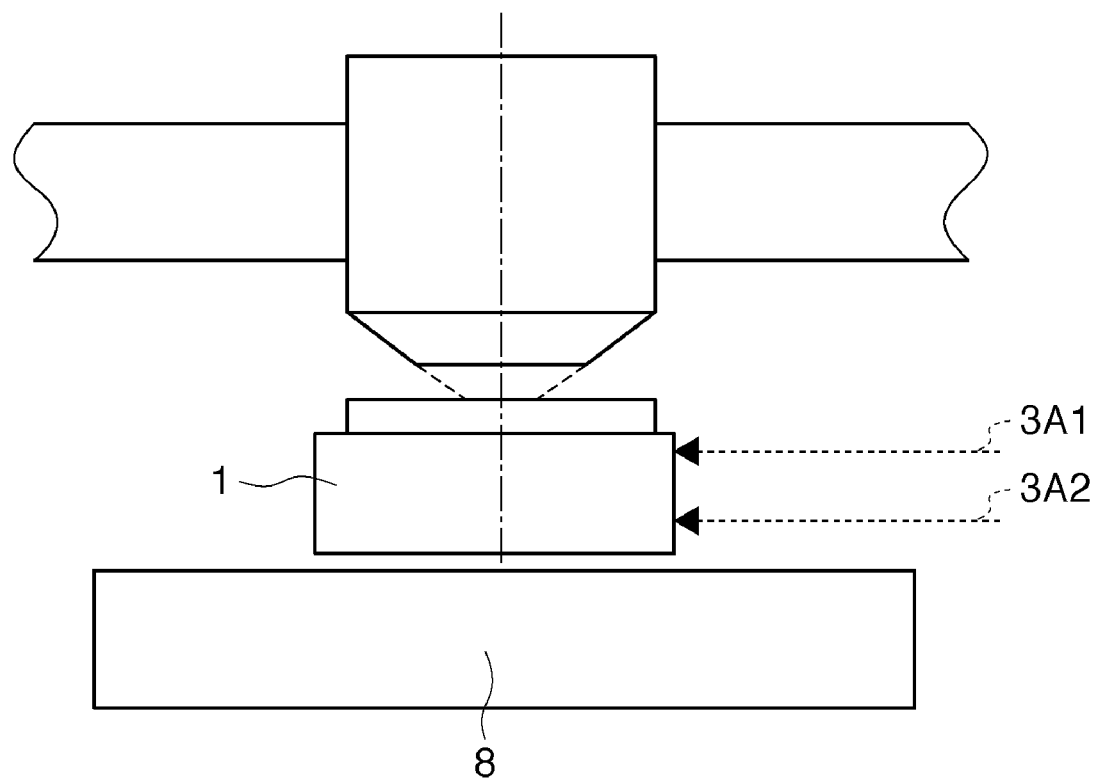
FIG. 4 is a view showing the reference stage arrangement of a stage base.
Figure 5:
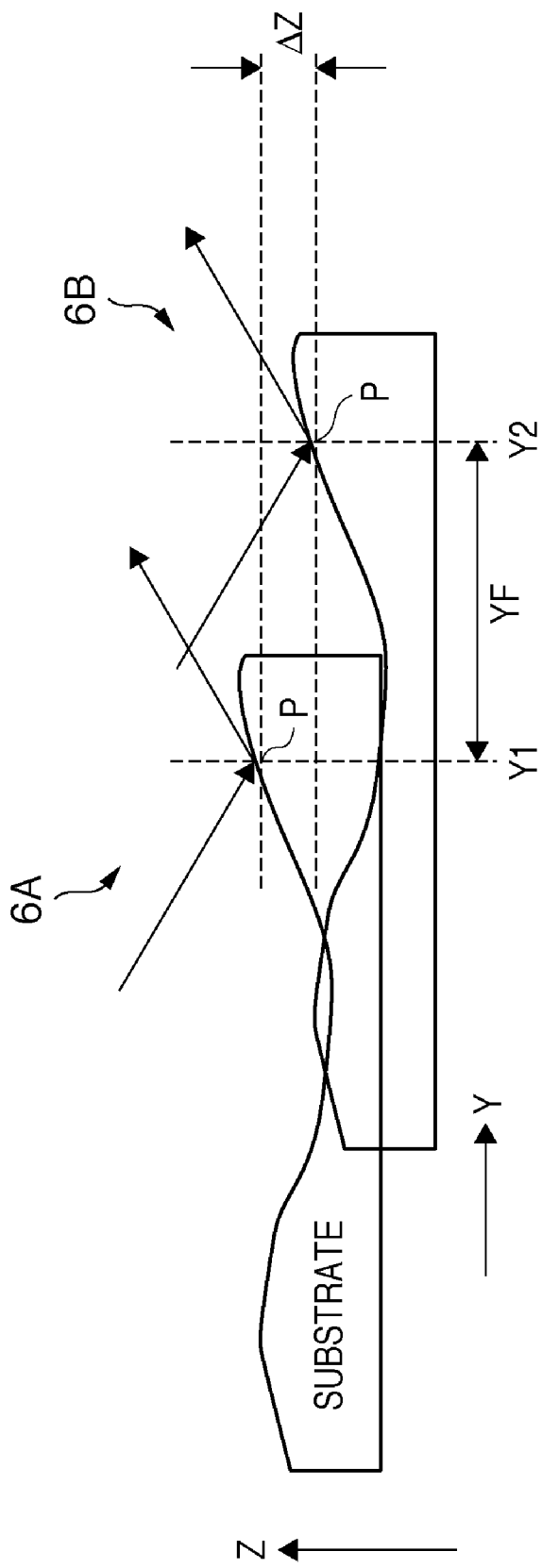
FIG. 5 is a view showing a method of measuring Z errors dependent on a stage position at a plurality of measurement points of a focus sensor.

In a Z bar mirror arrangement other than that described above, for example, a stage arrangement such as that shown in FIG. 3, a bar mirror 4F and a bar mirror 4E can be respectively defined as a ZX bar mirror and a ZY bar mirror.

A focus sensor as the first measurement device to measure the position of a substrate in the vertical direction at a plurality of measurement points 6A, 6B, and 6C is placed below the projection optical system (projection lens). This makes it possible to perform alignment between a pattern on a reticle and a substrate surface. The scanning exposure apparatus performs real-time focusing, that is, measuring a substrate surface in advance with the focus sensor at a position slightly before an actual exposure position (a slit position below the projection lens), and aligning the substrate surface with the lens image plane when the substrate moves to the exposure position. At this time, the focus position measured by the focus sensor differs from the actual exposure position. If, therefore, the measurement result has a difference accompanying the driving of the substrate stage 1 in the horizontal direction, that is, a stage moving error, the focus accuracy deteriorates at the exposure position, resulting in failure to accurately perform exposure. It is therefore essential to correct stage moving by, for example, accurately measuring the surface shape of the ZY bar mirror.

The first step will be described below. In the first step, the apparatus calculates the error of the Z bar mirror in the Z-axis direction due to stage moving, that is, the driving of the substrate stage in the horizontal direction, below the lens, that is, in the first area, by using the focus sensor. In this case, a ZY bar mirror will be exemplified. The first step is a technique which has conventionally been proposed.

Figure 8:
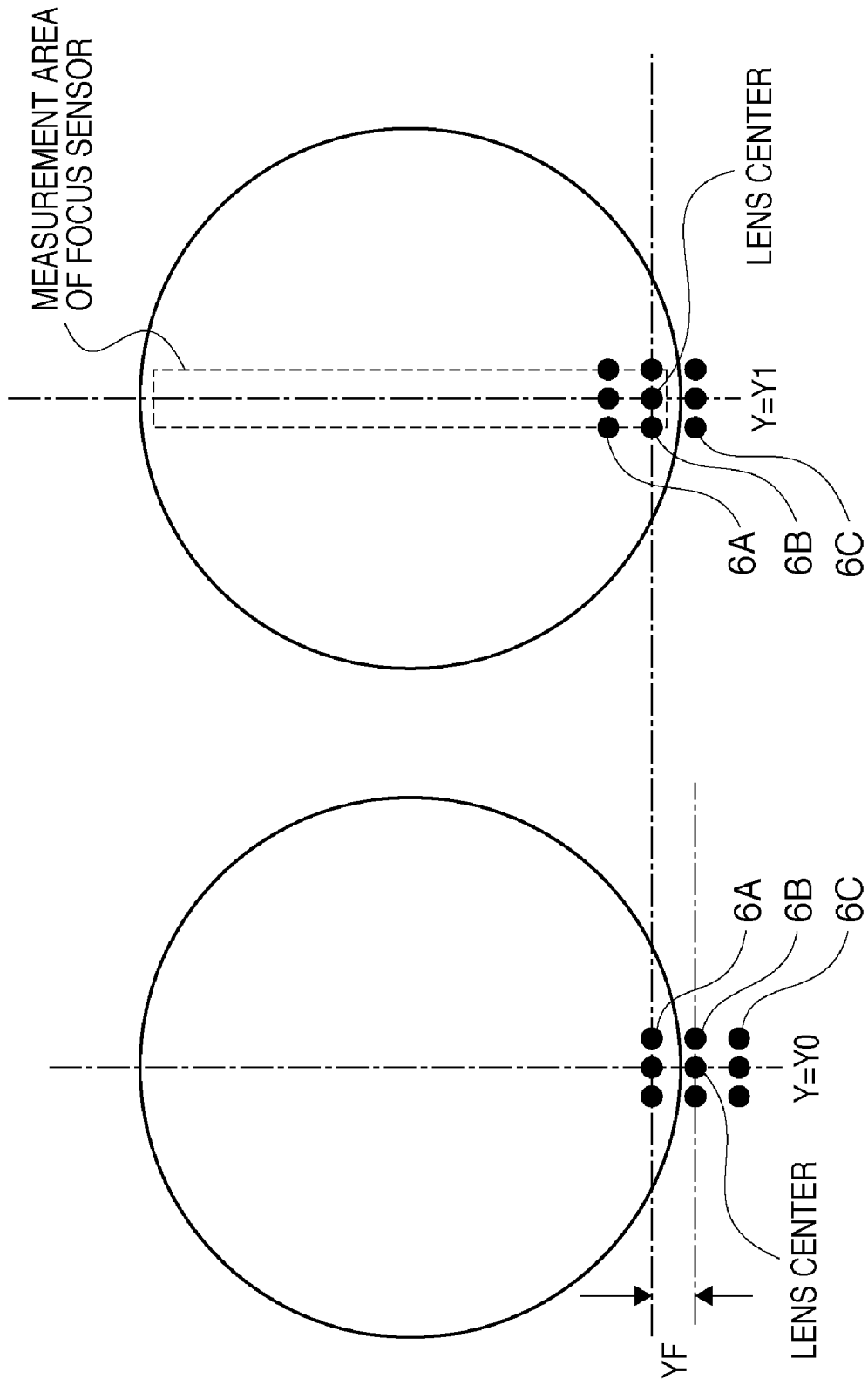
FIG. 8 is a view showing an area in which a Z error dependent on a stage position is measured at a plurality of measurement points of the focus sensor.

A substrate having no pattern is mounted on the substrate stage 1. Obviously, the surface shape of the substrate is preferably flat. There is no need to perform measurement on the entire substrate surface. When the shape of the ZY bar mirror is to be measured, it suffices to one-dimensionally measure the substrate in the Y-axis direction. In general, as shown in FIG. 8, a portion near the central axis of the substrate, where the broadest range can be measured, is measured in the Y-axis direction. In the subsequent measurement, the position of the substrate stage 1 in the X-axis direction is fixed at the center, and the substrate stage 1 is driven in only the Y-axis direction.

First of all, the lower end of the substrate is measured at the measurement point 6A of the focus sensor. In this case, the position of the substrate stage 1 in the Y-axis direction is represented by Y0, and the measurement result obtained at the measurement point 6A of the focus sensor is represented by A(Y0). Subsequently, the substrate stage 1 is driven by an interval YF in the Y-axis direction, and the same portion on the substrate is measured at the measurement point 6B. In this case, the position of the substrate stage in the Y-axis direction is represented by Y1. In this case, the measurement result obtained at the measurement point 6B of the focus sensor is represented by B(Y1), and the measurement result obtained at the measurement point 6A is represented by A(Y1). Likewise, the substrate stage 1 is driven by YF, and similar operation is performed up to the upper end of the substrate. As a result, Y0 to Yn have the following relationships:

$$Y1=Y0+YF$$

$$Y2=Y1+YF=Y0+2\times YF$$

$$\ldots$$

$$Yn=Yn-1+YF=Y0+n\times YF$$

The following are measurement results A(Y0 to Yn−1) and B(Y1 to Yn) obtained at the plurality of measurement points 6A and 6B before and after the substrate stage is driven by YF in the Y-axis direction. The measurement results A(Y0 to Yn−1) and B(Y1 to Yn) are the first measurement results obtained by the first measurement device when the substrate stage 1 is located in the first area.

$$A(Y0)$$

$$A(Y1), B(Y1),$$

$$A(Y2), B(Y2)$$

$$\ldots$$

$$A(Yn-1), B(Yn-1)$$

$$B(Yn)$$

In this case, A(Y0) and B(Y1) represent measurement results at the same portion on the substrate. That is, if the stage moves flat ideally, these measurement results show the same value. That is, the difference between the two measurement results indicates the amount by which stage moving deviates from an ideal plane, that is, the influence of the shape of the ZY bar mirror. A first difference based on the measurement results obtained by the first measurement device is defined as a Z error ΔZ caused when the stage is driven from Y0→Y1, as follows:

$$\Delta Z(Y0\rightarrow Y1)=B(Y1)-A(Y0)$$

$$\Delta Z(Y1\rightarrow Y2)=B(Y2)-A(Y1)$$

$$\ldots$$

$$\Delta Z(Yn-1\rightarrow Yn)=B(Yn)-A(Yn-1)$$

Each equation given above indicates an error difference caused when the substrate stage 1 is driven by YF. This value can be converted into the absolute value of the ZY bar mirror by accumulating the above calculation results. At this time, since there is no absolute value reference, assume that the error component of the bar mirror is 0 when the stage is at Y0.

$$Z(Y0)=0$$

$$Z(Y1)=Z(Y0)+\Delta z(Y0\rightarrow Y1)=0+\Delta Z(Y0\rightarrow Y1)$$

$$Z(Y2)=Z(Y1)+\Delta z(Y1\rightarrow Y2)=\\0+\Delta Z(Y0\rightarrow Y1)+\Delta z(Y1\rightarrow Y2)$$

$$\ldots$$

$$Z(Yn)=Z(Yn-1)+\Delta z(Yn-1\rightarrow Yn)=\\ \Delta Z(Y0\rightarrow Y1)+\ldots+\Delta z(Yn-1\rightarrow Yn)$$

In this case, Y=Y0 is set as a reference for the ZY bar mirror. However, this is only for the sake of convenience of calculation, and no problems arise regardless of which position is set as a reference. If, for example, Y=Yc is to be set as a reference for the ZY bar mirror, it suffices to subtract the value of Z(Yc) from all arrays. The following are mathematical expressions of this operation:

$$Z(Y0)\rightarrow Z(Y0)-Z(Yc)$$

$$Z(Y1)\rightarrow Z(Y1)-Z(Yc)$$

$$\ldots$$

$$Z(Yc)\rightarrow Z(Yc)-Z(Yc)=0$$

$$\ldots$$

$$Z(Yn)\rightarrow Z(Yn)-Z(Yc)$$

Figure 13:
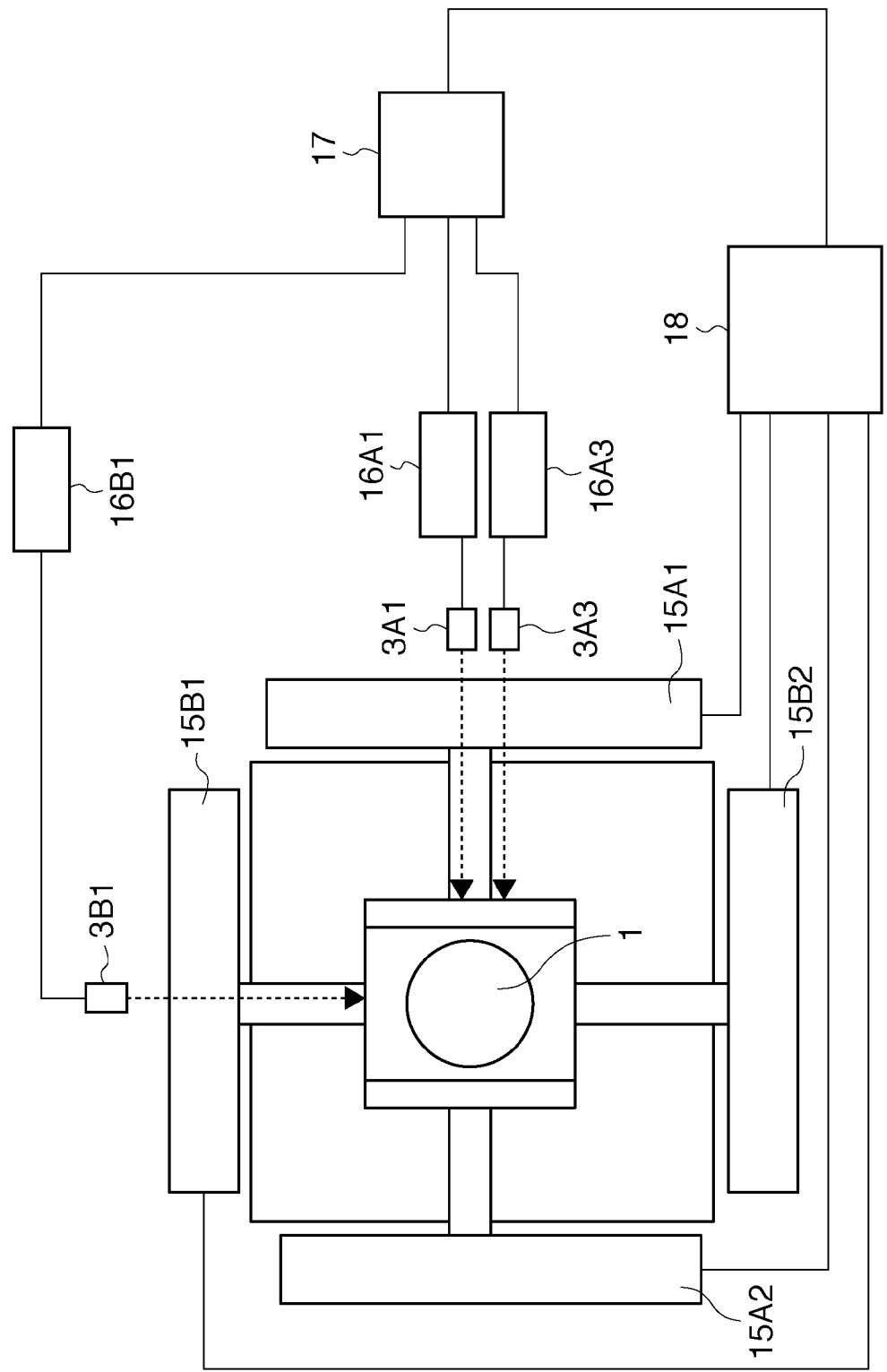
FIG. 13 is a control block diagram for controlling a stage.

A memory in a controller 17 of the apparatus shown in FIG. 13 stores the shape calculated in the above manner as a function of the shape of the ZY bar mirror. In practice, when the substrate stage 1 is to be driven, this apparatus measures the current position of the substrate stage 1 from the information obtained by the laser interferometer 3B1, calculates a correction amount in the Z-axis direction from the current position and the function of the ZY bar mirror, and adds the correction amount to the target position of the substrate stage 1 in the Z-axis direction. In the calculation of a correction amount for the actual driving of the substrate stage 1, it is necessary to perform interpolation calculation between sample points. Although not described in detail below, it suffices to perform interpolation calculation between sample points by a linear or higher-order function or by a spline function. It is also possible to use a technique of setting sample intervals shorter than YF.

If the measurement points 6A, 6B, and 6C of the focus sensor each include a plurality of measurement points in the X direction, when the substrate stage 1 is driven in the Y-axis direction, the apparatus can measure and correct the tilt (to be referred to as a tilt X) of the substrate stage 1 in the X-axis direction in the same manner. Although the above mathematical expression is derived without using the measurement point 6C, using this measurement point makes it possible to measure and correct the tilt (to be referred to as a tilt Y) of the substrate stage 1 in the Y-axis direction in the same manner when the substrate stage 1 is driven in the Y-axis direction.

In the range in which the substrate can be measured, it is possible to correct the stage moving into an ideal plane and improve the focus accuracy when transferring a pattern onto the substrate. Since high focus accuracy is generally required to expose a pattern on a substrate to light, this effect is very large.

When an alignment mark on a substrate is to be measured by using the OAS, since the range in which the substrate stage 1 is driven falls outside the above correction function, high focus accuracy cannot be obtained. If, for example, the lens center is spaced apart from the OAS center by Yo, the correction function is shorter by the length represented by Yo. If a focus sensor is located below the OAS, driving the substrate stage 1 in the Z-axis direction based on the focus sensor can drive a mark on the substrate to the best focus position of the OAS. However, depending on the bar mirror shape, the Z driving amount increases, and it takes much time for driving. This leads to reductions in throughput and the productivity of the apparatus. In general, since there is no focus sensor at the OAS position, which can perform measurement at a plurality of measurement points, it is impossible to measure the ZY bar mirror at the plurality of measurement points described above. This embodiment, however, measures the ZY bar mirror at one measurement point by using the focus sensor. This focus sensor which measures the ZY bar mirror at one measurement point forms the second measurement device which measures the position of a substrate in the vertical direction in the second area (OAS area).

Figure 11:
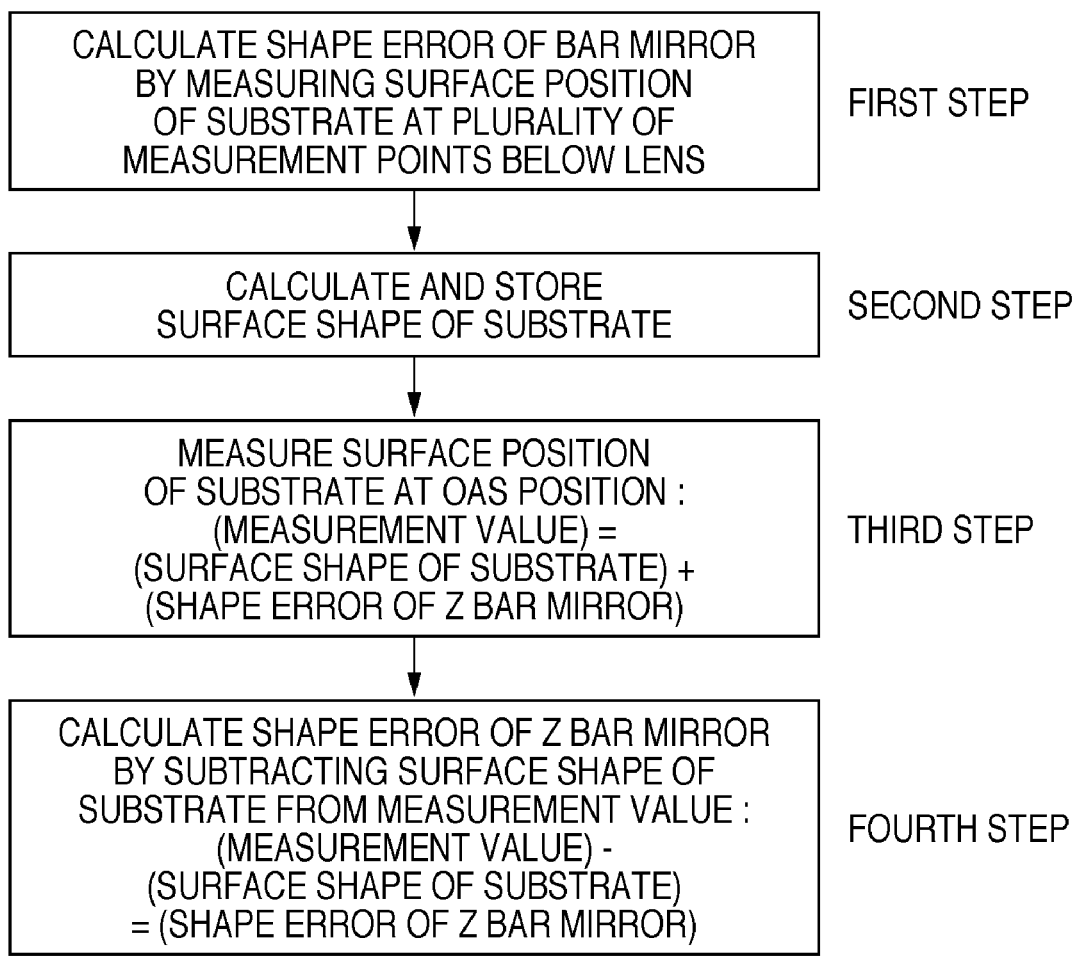
FIG. 11 is a flowchart showing a sequence by the single stage.

That is, in addition to a step (first step) similar to that in the conventional scheme, this embodiment performs the second and subsequent steps (to be described below), as shown in FIG. 11.

In the second step, first of all, it is necessary to calculate numerical values representing the surface shape of the substrate. For this purpose, the apparatus uses measurement results on the ZY bar mirror which are obtained by using a plurality of measurement points on the substrate.

Consider first the meanings of measurement results $B(Y1)$, $B(Y2), \ldots, B(Yn)$ obtained at the measurement point 6B of the focus sensor. These measurement results are obtained by simply measuring the substrate surface. That is, these results include the surface shape components of the substrate and stage moving plane errors originating from the shape of the ZY bar mirror, and are not separated. That is, letting $W(Y1)$, $W(Y2), \ldots, W(Yn)$ be numerical values representing the surface shape of the substrate, the respective measurement values at the measurement point 6B of the focus sensor can be expressed as follows:

$$B(Y1)=W(Y1)+Z(Y1)$$

$$B(Y2)=W(Y2)+Z(Y2)$$

$$\ldots$$

$$B(Yn)=W(Yn)+Z(Yn)$$

In this case, $Z(Y)$ represents the shape error of the ZY bar mirror which is the first difference in the vertical direction caused when the substrate stage in an area below the lens is driven in the horizontal direction. The shape error of the ZY bar mirror has already been calculated by using the measurement results obtained at the plurality of measurement points 6A and 6B of the focus sensor. It is therefore possible to calculate numerical values representing the surface shape of the substrate by performing the following subtraction using the controller 17:

$$W(Y1)=B(Y1)-Z(Y1)$$

$$W(Y2)=B(Y2)-Z(Y2)$$

$$\ldots$$

$$W(Yn)=B(Yn)-Z(Yn)$$

In the third step, the apparatus then measures the same substrate surface by using the focus sensor as the second measurement device below the OAS as the second area. The second measurement result as the above measurement result is defined as follows:

$$O(Y1+Yo)$$

$$O(Y2+Yo)$$

$$\ldots$$

$$O(Yn+Yo)$$

In this case, Yo represents the distance from the lens center to the OAS center. Like the focus measurement result below the lens, this measurement result is the aggregate of the substrate shape of the substrate and the shape error of the ZY bar mirror in the second area. That is, the measurement results obtained by the focus sensor below the OAS are represented by $$O(Y1+Yo)=W(Y1)+Z(Y1+Yo)$$

$$O(Y2+Yo)=W(Y2)+Z(Y2+Yo)$$

$$\ldots$$

$$O(Yn+Yo)=W(Yn)+Z(Yn+Yo)$$

In this case, the surface shape $W(Y)$ of the substrate has already been calculated in the second step. In the fourth step, therefore, the controller 17 can calculate the shape error of the ZY bar mirror at the OAS position by using the following subtraction equations. The shape error of the ZY bar mirror at the OAS position is the second difference in the vertical direction caused when the substrate stage in the second area is driven in the horizontal direction.

$$Z(Y1+Yo)=O(Y1+Yo)-W(Y1)$$

$$Z(Y2+Yo)=O(Y2+Yo)-W(Y2)$$

$$\ldots$$

$$Z(Yn+Yo)=O(Yn+Yo)-W(Yn)$$

If the length of Yo is longer than the range (Yn-Y1) of the substrate, that is, Yo>Yn-Y1, an area for which no correction function is generated by the ZY bar mirror is generated. In a place where high Z positioning accuracy is required, if the shape error of the ZY bar mirror has been measured, no practical problem arises.

If the length of Yo is shorter than the range of the substrate, that is, Yo<Yn-Y1, the ZY bar mirror shape measured below the OAS overlaps the correction function of the ZY bar mirror shape measured below the lens. In this case, for the overlapping area, it suffices to use only one of the functions or the average or weighted average of the two functions.

In this embodiment, even in a place where a substrate surface cannot be measured at a plurality of measurement points by the focus sensor, if a focus sensor capable of performing measurement at one measurement point is available, the shape of the ZY bar mirror can be measured, and a stage moving plane can be corrected.

According to the conventional scheme, it is possible to obtain a Z error dependent on the position of the substrate stage as long as a focus sensor capable of performing measurement at at least two measurement points is available. As shown in FIG. 6, arranging at least three measurement points of the focus sensor in each of the X- and Y-axis directions can measure a stage tilt dependent on the position of the substrate stage. In addition, in this embodiment, arranging a plurality of measurement points of the focus sensor at the OAS position can measure a tilt. At the lens position, at least three measurement points of the focus sensor are required because of the subtraction of the surface shape of the substrate. In contrast, as shown in FIG. 10, at the OAS position, since the substrate shape is known, at least two measurement points are required in each of the X- and Y-axis directions.

Figure 10:
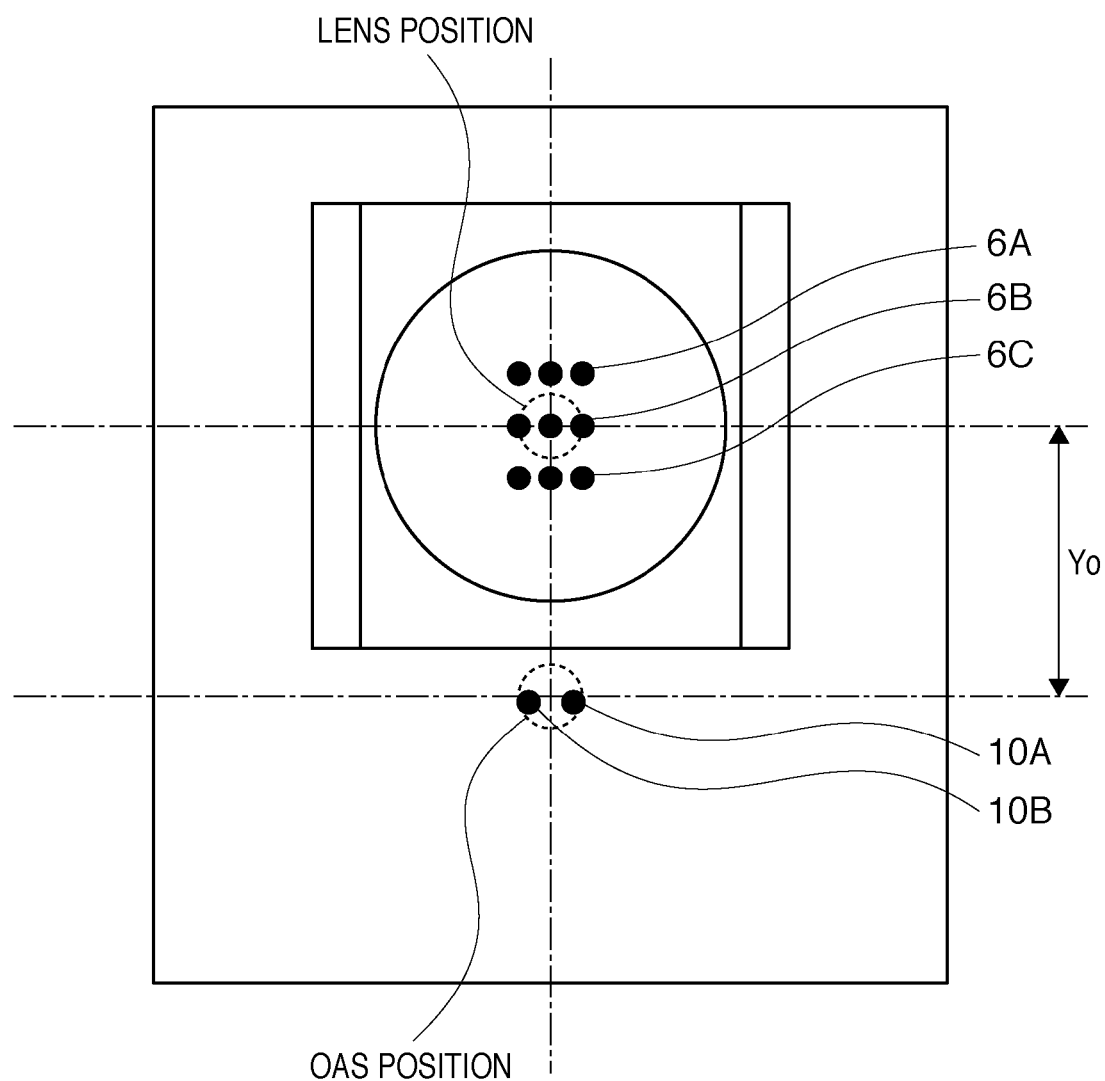
FIG. 10 is a view showing a state in which a plurality of measurement points of the focus sensor is arranged at the OAS position.

According to the example shown in FIG. 10, it is possible to calculate a Z position error, which is caused when the substrate stage 1 is driven in the Y-axis direction, from the average of the measurement results obtained at two measurement points 10A and 10B of the focus sensor. In addition, the tilt X can be calculated from the difference between the measurement results obtained at the two measurement points 10A and 10B. Likewise, the tilt Y can be measured by also arranging at least two measurement points in the Y-axis direction.

Placing a focus sensor capable of performing measurement at a plurality of measurement points at the OAS position is disadvantageous in terms of cost. In general, therefore, only a focus sensor capable of performing measurement at only one measurement point is placed at the OAS position. It is also possible to provide a mechanism of changing one measurement point of the focus sensor in the X-axis direction or the Y-axis direction. In this case, the focus sensor at the OAS position measures the surface shape of the substrate at the measurement point 10A in FIG. 10. The measurement point is then changed to the measurement point 10B to perform measurement in the same manner. This increases the number of times of measurement and prolongs the time for measurement. However, it is possible to suppress the cost of the apparatus. The same applies to the Y-axis direction.

In the third step, the focus sensor blow the OAS preferably measures the same portion of the substrate as that measured by the focus sensor below the lens in the first step. However, if the data obtained by function-approximating the surface shape of the substrate is to be used, the place where measurement is performed in the third step need not be completely the same as the portion measured in the first step. It suffices to calculate data of the substrate in the vertical direction at the same portion as that of the substrate which is measured by the focus sensor in the second area by interpolating the measurement result obtained by the focus sensor in the first area.

Figure 9:
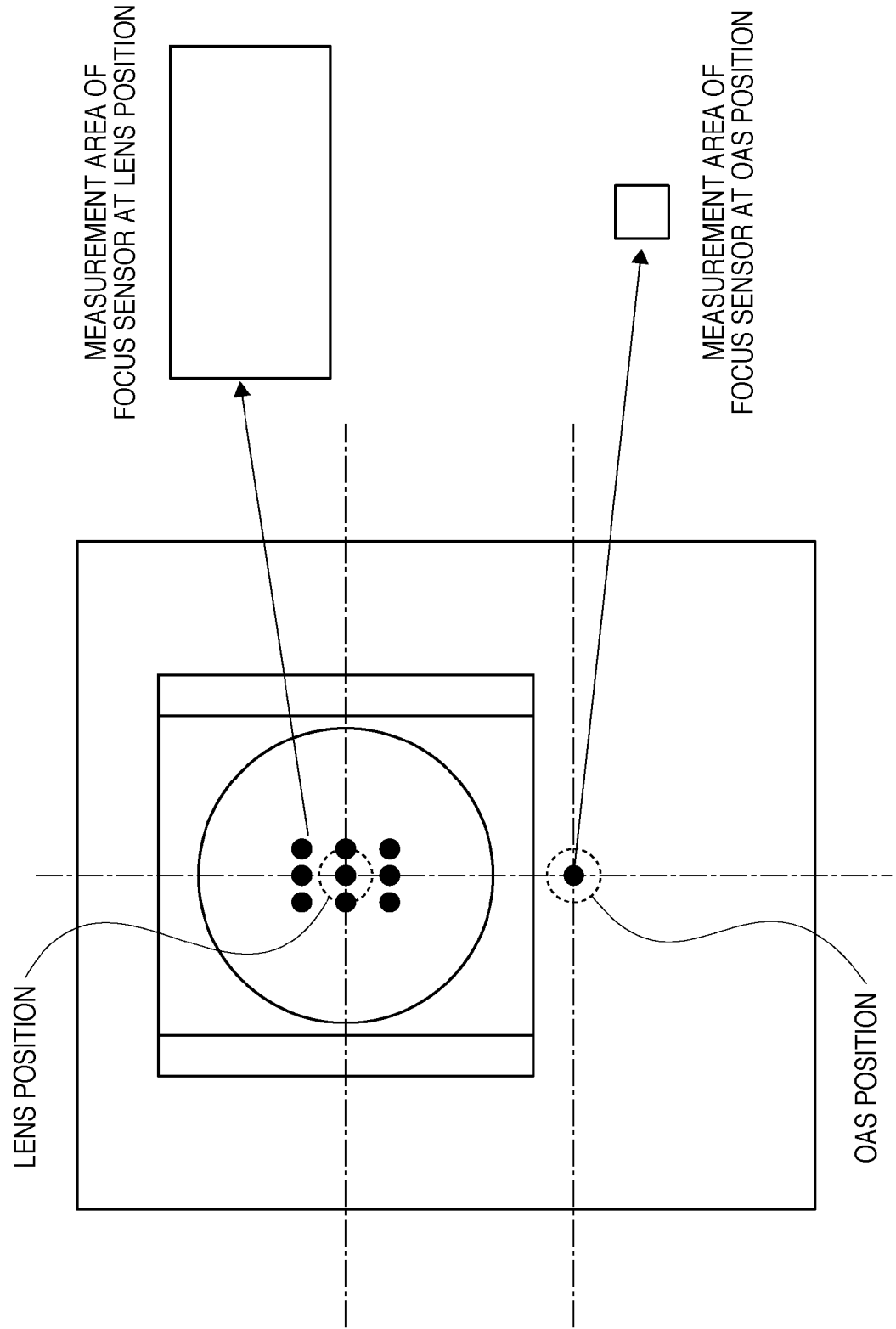
FIG. 9 is a view showing the measurement ranges of focus sensors at the lens position and the OAS position.

When the measurement range of one measurement on a substrate by the focus sensor below the lens differs from that by the focus sensor below the OAS, the shape of light projected on the substrate which is detected by the focus sensor below the lens may differ from that by the focus sensor below the OAS. For example, such a phenomenon occurs in the case of a focus sensor which makes a substrate surface reflect light from an LED or the like and makes a CCD or the like measure the reflected light, as shown in FIG. 9. Below the lens, it is necessary to move a relatively wide range of an exposure area (20-odd mm square area or 20-odd mm×several mm slit-like area) to the best focus position of the lens. In this case, in order to make the focus sensor less susceptible to fine patterns, the measurement area is set to be large to a certain extent. In contrast to this, the measurement range of the OAS is as very small as several μm square to 10-odd μm square, and hence the measurement area of the focus sensor at the OAS position can be very small. In such a case, it suffices to perform measurement by the focus sensor with a smaller measurement range a plurality of number of times and average the results so as to broaden the measurement range. Alternatively, it suffices to finely move the substrate stage 1 in the X and Y directions while performing measurement by both the focus sensors at the lens position and the OAS position so as to measure the same range.

Second Embodiment

The second embodiment is an application of the present invention to an exposure apparatus with a twin-stage arrangement having a plurality of substrate stages. The exposure apparatus with the twin-stage arrangement measures a substrate in a measurement area as a first area, and performs exposure via a projection optical system placed in an exposure area as a second area while positioning the substrate measured in the first area in accordance with the measurement result.

In the case of the twin-stage arrangement, assume that two substrate stages 1 each like that shown in FIG. 3 are arranged side by side. In this case, X-Y interferometers are independently arranged in an area below the lens, which is the second area, and an area below the OAS, which is the first area, and the substrate stages 1 are independently controlled.

Figure 12:
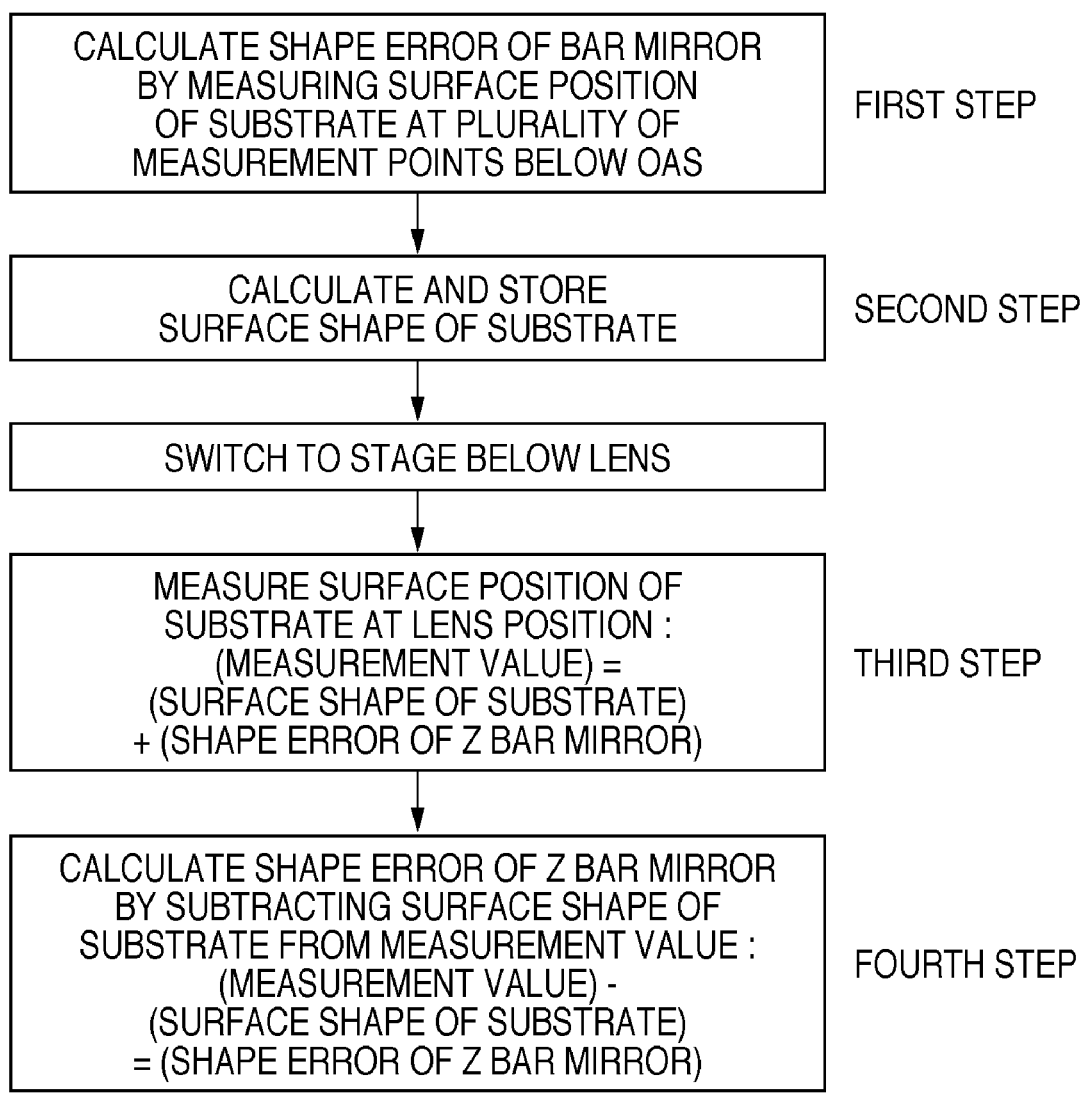
FIG. 12 is a flowchart showing a sequence by the twin stages.

FIG. 12 shows the details of an exposure sequence using the apparatus with the twin-stage arrangement. In general, when the substrate stage 1 is located below the OAS, the apparatus measures a mark of each shot on a substrate, and measures the shape of the entire substrate surface with a focus sensor. At this time, a focus sensor is placed to have a certain length in the X-axis direction, and measures a focus while the substrate stage 1 scans the entire substrate surface in the Y-axis direction. The shape of the entire substrate surface is measured by repeating scanning in the Y-axis direction in the same manner while shifting the substrate in the X-axis direction. In actual exposure, the apparatus drives the substrate stage 1 to the lens position while holding the substrate on the stage, and can accurately perform exposure based on the mark measurement (X-Y displacement of a shot) performed at the OAS position and the information of the measurement result (the surface shape of the substrate) obtained by the focus sensor.

It is possible to calculate the shape of the ZX bar mirror by using the focus sensor below the OAS. Since the shape of the ZX bar mirror is measured in the same manner as in the case of the single-stage arrangement, a detailed description of the operation will be omitted. However, it is possible to accurately measure the shape of the ZX bar mirror (first step). At the same time, the apparatus also calculates numerical values representing the surface shape of the substrate in advance (second step).

Assume that the substrate stage 1 below the lens has moved, and there is a focus sensor having only one measurement point. In this case, a substrate surface is measured by using this focus sensor (third step). At this time, it is ideal to measure the same portion on the substrate as that measured by the focus sensor below the OAS. If the data obtained by function-approximating the surface shape of the substrate is used, it is not necessary to measure completely the same place.

The measurement result obtained by the focus sensor below the lens is the aggregate of the surface shape of the substrate and the shape of the ZX bar mirror. Since the surface shape of the substrate has already been calculated, it is possible to calculate the shape of the ZX bar mirror blow the lens by subtracting this value (fourth step).

When measurement is to be performed in the Y direction, it is necessary to also array measurement points of the focus sensor below the OAS in the Y direction. In a twin-stage arrangement using a stage arrangement like that shown in FIG. 3, as a ZY bar mirror, a common bar mirror is used below the lens and the OAS. Even if, therefore, the shape of the bar mirror is not accurately measured, the measurement result obtained by measuring the shape of the entire substrate surface below the OAS includes the shape of the bar mirror. Even if the apparatus performs exposure by using this information, no focus error occurs. In this case as well, since different ZX bar mirrors are used below the lens and the OAS, it is necessary to accurately calculate the shape. For this reason, using focus sensors juxtaposed in the X direction has a significant meaning.

In the twin-stage arrangement, improving the accuracy of stage switching may eliminate the necessity to arrange any focus sensors. In this case, in the third step, the apparatus measures the relationship between the image plane of the lens and the position of the substrate surface by actually exposing a pattern to light and analyzing the resultant image. That is, if the exposed image is at the best focus, it indicates that the substrate surface coincides with the lens image plane. If the image is defocused, the displacement between the substrate surface and the lens image plane is obtained from the defocus amount. Performing this operation for the entire substrate surface by driving the stage can obtain measurement values similar to those obtained in the third step using the focus sensor.

[Explanation of Exposure Apparatus]

Figure 14:
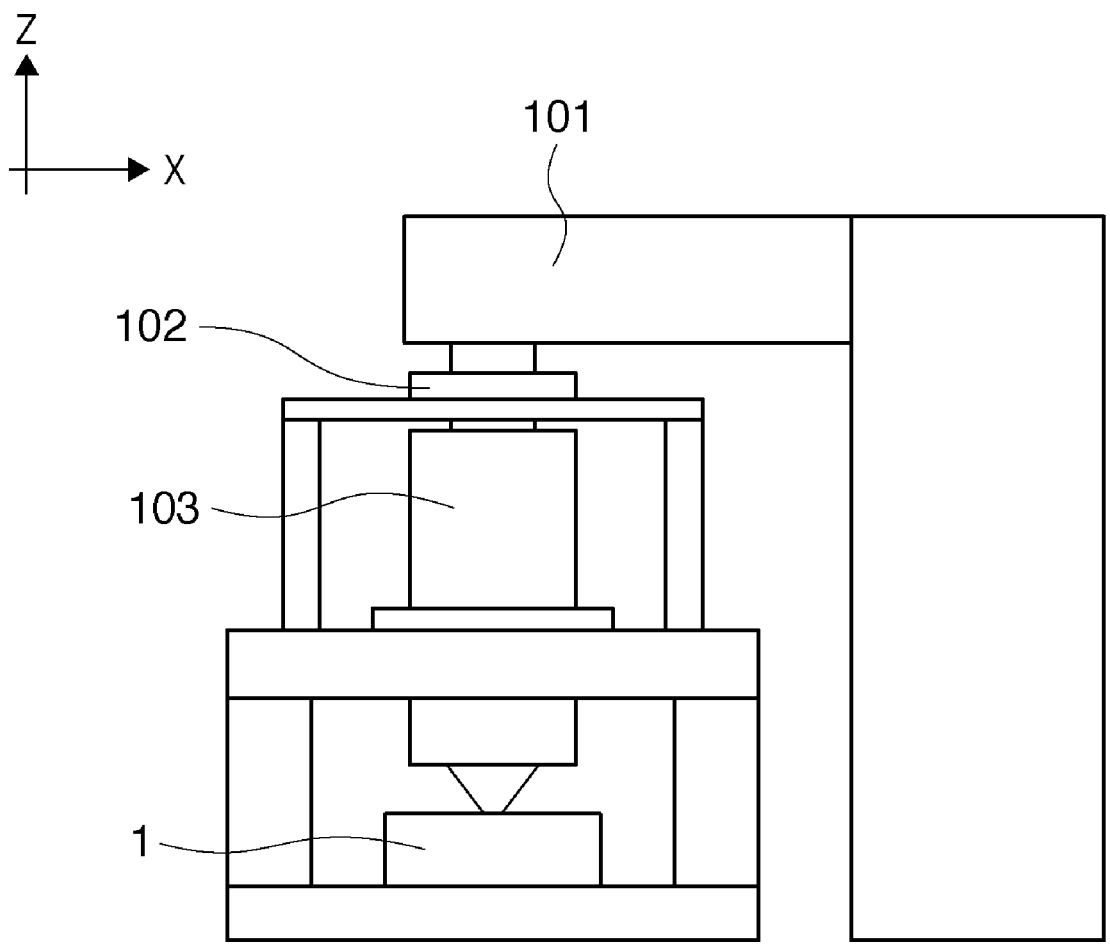
FIG. 14 is a view showing an example of an exposure apparatus.

An exemplary exposure apparatus with a single-stage arrangement to which the present invention is applied will be described below. As shown in FIG. 14, the exposure apparatus includes an illumination device 101, a reticle stage 102 on which a reticle is mounted, a projection optical system 103, and a substrate stage 1 which holds a substrate. A driving mechanism (not shown) operates/moves the substrate stage 1 in the Y direction, and moves the stage step by step in the X direction, as described above. The exposure apparatus projects and transfers by exposure a circuit pattern formed on a reticle onto a substrate.

The illumination device 101 illuminates a reticle on which a circuit pattern is formed, and has a light source unit and illumination optical system. The light source unit uses, for example, a laser as a light source. The laser can be, for example, an ArF excimer laser with a wavelength of about 193 nm, a KrF excimer laser with a wavelength of about 248 nm, or an F2 excimer laser with a wavelength of about 153 nm. However, the type of laser is not particularly limited to an excimer laser and may be, for example, a YAG laser, and the number of lasers is not particularly limited either. When a laser is used as the light source, an optical system for shaping a parallel light beam from the laser beam source into a desired beam shape, and an optical system for converting a coherent laser beam into an incoherent one are preferably used. Also, the light source which can be used for the light source unit is not particularly limited to a laser, and one or a plurality of mercury lamps or xenon lamps can be used. The illumination optical system is an optical system which illuminates a mask and includes, for example, a lens, mirror, light integrator, and stop.

The projection optical system 103 can be, for example, an optical system having a plurality of lens elements alone, an optical system having a plurality of lens elements and at least one concave mirror, an optical system having a plurality of lens elements and at least one diffraction optical element such as a kinoform, or an all-mirror type optical system.

The reticle stage 102 and the substrate stage 1 can move by, for example, a linear motor. The respective stages synchronously move. Actuators (driving mechanisms) (not shown) are provided to the substrate stage 1 and the reticle stage 102 to align the reticle pattern on the substrate.

A method of manufacturing a device such as a semiconductor integrated circuit device or a liquid crystal display device by using the exposure apparatus according to the first and second embodiments will be exemplified next.

Devices are manufactured by an exposing step of transferring by exposure a pattern onto a substrate using the above exposure apparatus, a developing step of developing the substrate exposed in the exposing step, and other known steps (e.g., etching, resist removal, dicing, bonding, and packaging steps) of processing the substrate developed in the developing step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-158550, filed Jun. 17, 2008, which is hereby incorporated by reference herein in its entirety.

What is claimed is:

1. An exposure apparatus which projects a pattern on a reticle onto a substrate via a projection optical system and scanning-exposes the substrate, the apparatus comprising:
 a driving mechanism configured to drive a substrate stage holding the substrate in a horizontal direction and a vertical direction in each of a first area and a second area;
 a first measurement device configured to measure a position of the substrate in the vertical direction at a plurality of measurement points in the first area; and
 a controller,
 wherein when the substrate stage is located in the first area, said controller causes said first measurement device to measure the same portion of the substrate at the plurality of measurement points both before and after the substrate stage is driven in the horizontal direction, calculates a first difference of the substrate stage in the vertical direction in the first area accompanying driving of the substrate stage in the horizontal direction, based on a first measurement result obtained by using said first measurement device,
 calculates a numerical value representing a surface shape of the substrate by subtracting the first difference from the first measurement result,
 calculates a second difference of the substrate stage in the vertical direction in the second area accompanying driving of the substrate stage in the horizontal direction by subtracting the numerical value associated with the surface shape of the substrate from a numerical value representing a position of the substrate in the vertical direction when the substrate stage is located in the second area, and controls a position of the substrate stage in the vertical direction in the second area based on the second difference.

2. The apparatus according to claim 1, further comprising a second measurement device configured to measure a position of the substrate in the vertical direction at a measurement point in the second area, wherein the numerical value representing the position of the substrate in the vertical direction when the substrate stage is located in the second area is obtained from a second measurement result obtained by using said second measurement device.

3. The apparatus according to claim 2, wherein a portion of a substrate which said first measurement device measures at the plurality of measurement points coincides with a portion of the substrate which said second measurement device measures at the measurement point.

4. The apparatus according to claim 2, wherein said controller calculates data of the same portion of the substrate in the vertical direction as that of the substrate which said second measurement device measures at the measurement point by interpolating the first measurement result, and calculates the first difference based on the data calculated by interpolation.

5. The apparatus according to claim 3, wherein when measurement ranges of a substrate in which said first measurement device and said second measurement device perform one measurement differ from each other, at least one of said first measurement device and said second measurement device performs measurement a plurality of number of times to match the measurement ranges of the substrate in which said first measurement device and said second measurement device perform measurement.

6. The apparatus according to claim 4, wherein when measurement ranges of a substrate in which said first measurement device and said second measurement device perform one measurement differ from each other, at least one of said first measurement device and said second measurement device performs measurement a plurality of number of times to match the measurement ranges of the substrate in which said first measurement device and said second measurement device perform measurement.

7. The apparatus according to claim 1, wherein the numerical value representing the position of the substrate in the vertical direction when the substrate stage is located in the second area is obtained from a defocus amount of a pattern formed on the substrate located in the second area by exposure.

8. The apparatus according to claim 1, further comprising, in the second area, an off-axis scope configured to detect a position of an alignment mark placed on the substrate, wherein said projection optical system is located near said first measurement device in the first area.

9. The apparatus according to claim 1, wherein the apparatus includes a plurality of substrate stages each identical to the substrate stage, measures a substrate in the first area, and exposes the substrate measured in the first area to light via said projection optical system placed in the second area while positioning the substrate in accordance with a measurement result on the substrate.

10. A method of manufacturing a device, the method comprising:

scanning-exposing a substrate using an exposure apparatus;

developing the exposed substrate; and processing the developed substrate to manufacture the device, wherein the exposure apparatus comprises a driving mechanism configured to drive a substrate stage holding the substrate in a horizontal direction and a vertical direction in each of a first area and a second area, a first measurement device configured to measure a position of the substrate in the vertical direction at a plurality of measurement points in the first area, and a controller, the controller, when the substrate stage is located in the first area, causing the first measurement device to measure the same portion of the substrate at the plurality of measurement points both before and after the substrate stage is driven in the horizontal direction, calculating a first difference of the substrate stage in the vertical direction in the first area accompanying driving of the substrate stage in the horizontal direction, based on a first measurement result obtained by using the first measurement device, calculating a numerical value representing a surface shape of the substrate by subtracting the first difference from the first measurement result, calculating a second difference of the substrate stage in the vertical direction in the second area accompanying driving of the substrate stage in the horizontal direction by subtracting the numerical value associated with the surface shape of the substrate from a numerical value representing a position of the substrate in the vertical direction when the substrate stage is located in the second area, and controlling a position of the substrate stage in the vertical direction in the second area based on the second difference.

* * * * *